United States Patent
Han

(10) Patent No.: US 8,664,521 B2
(45) Date of Patent: Mar. 4, 2014

(54) HIGH EFFICIENCY SOLAR CELL USING PHOSPHORS

(75) Inventor: Sang-Do Han, Daejeon (KR)

(73) Assignee: Korea Institute of Energy Research, Daejeon (KR)

( * ) Notice: Subject to any disclaimer, the term of this patent is extended or adjusted under 35 U.S.C. 154(b) by 124 days.

(21) Appl. No.: 13/515,199

(22) PCT Filed: Nov. 23, 2010

(86) PCT No.: PCT/KR2010/008280
§ 371 (c)(1),
(2), (4) Date: Jun. 11, 2012

(87) PCT Pub. No.: WO2011/078486
PCT Pub. Date: Jun. 30, 2011

(65) Prior Publication Data
US 2012/0260984 A1    Oct. 18, 2012

(30) Foreign Application Priority Data

Dec. 24, 2009  (KR) .......................... 10-2009-0130910

(51) Int. Cl.
*H01L 31/0232* (2006.01)
*H01L 31/18* (2006.01)
*H01L 31/0224* (2006.01)

(52) U.S. Cl.
USPC ....... 136/257; 136/252; 438/72; 257/E31.127

(58) Field of Classification Search
USPC ............. 136/257, 252; 438/72; 257/E31.127
See application file for complete search history.

(56) References Cited

U.S. PATENT DOCUMENTS

| 6,447,879 B1 * | 9/2002 | Sakurai et al. ............... 428/161 |
| 7,537,714 B2 * | 5/2009 | Choi et al. ................. 252/520.5 |
| 8,486,299 B2 * | 7/2013 | Huang et al. .......... 252/301.4 R |
| 2004/0040594 A1 * | 3/2004 | Andriessen ................... 136/263 |
| 2012/0211077 A1 * | 8/2012 | Shin et al. .................... 136/257 |

FOREIGN PATENT DOCUMENTS

| JP | 2003-142716 A | 5/2003 |
| JP | 2006-173545 A | 6/2006 |
| KR | 10-2009-0069894 A | 7/2009 |

OTHER PUBLICATIONS

International Search Report and Written Opinion dated Aug. 12, 2011 from International Applcation No. PCT/KR2010/008280, filed Nov. 23, 2010.

* cited by examiner

*Primary Examiner* — Golam Mowla
(74) *Attorney, Agent, or Firm* — Brian R. Morrison; Westerman, Champlin & Koehler, P.A.

(57) ABSTRACT

A high efficiency solar battery using a fluorescent substance to efficiently use incident light and thereby improve conversion efficiency. The solar battery of the present invention comprises: a front part including a front electrode and configured to receive light; a generating part disposed behind the front part to generate electricity from specific wavelengths of light incident through the front part; and a rear part disposed behind the generating part and comprising a rear electrode, wherein a first fluorescent substance is dispersed in the front part so as to absorb light having wavelengths different from the specific wavelengths, convert the absorbed light into light having the specific wavelengths, and output the converted light.

23 Claims, 2 Drawing Sheets

HIGH EFFICIENCY SOLAR CELL USING PHOSPHORS

CROSS-REFERENCE TO RELATED APPLICATION(S)

This Application is a 371 National Stage Application of International Application No. PCT/KR2010/008280, filed on Nov. 23, 2010, published as International Publication No. WO2011/078486, which claims priority to Korean Patent Application No. 10-2009-0130910, filed on Dec. 24, 2009, the contents of which are incorporated by reference in their entireties.

TECHNICAL FIELD

The present invention relates to a high efficiency solar cell, and more particularly to a high efficiency solar cell which employs phosphors to improve use efficiency of light entering the solar cell, thereby improving conversion efficiency.

BACKGROUND ART

Generally, a solar cell refers to a generator which absorbs light to generate and transfer electricity to the outside, and has attracted attention as a type of reproducible power generation system which does not use fossil fuel.

Solar cells may be generally classified into semiconductor type solar cells and dye-sensitized solar cells according to a principle of power generation. Semiconductor solar cells refer to photovoltaic cells, which employ photovoltaic power generated in a P-N junction between a P-type semiconductor and an N-type semiconductor. The semiconductor type solar cells may be classified into a silicon solar cell, a compound semiconductor solar cell, and an organic solar cell according to materials used.

Although some solar cells exhibit significantly high conversion efficiency in laboratory tests, typical solar cells exhibit conversion efficiency ranging from about 10% (organic solar cell) to about 18% (silicon solar cell) in practice. For the solar cells, it is an important issue to improve conversion efficiency.

In recent years, various efforts have been made to improve conversion efficiency of the solar cell not only through development of new materials, but also through optimal use of light incident on the solar cell.

As part of such efforts, studies have been made to collect as much light as possible when sunlight enters the solar cell. In one method, an anti-reflection layer is formed on an incident plane, through which light enters the solar cell, to prevent reflection on the incident plane, and a surface of the incident plane is subjected to texturing to induce diffuse reflection. In another method, a reflective film is formed on a rear side of the solar cell in order to use light passing through the solar cell.

Meanwhile, when generating electric power, the solar cell employs light in a predetermined wavelength range depending on the type (material) of solar cell instead of employing all components of light entering the solar cell. For this purpose, the band gap of a solar cell material, the depth of a P-N junction, a coefficient of light absorption, and the like are selectively determined.

FIG. 2 is a graph depicting energy distribution of sunlight and spectral distribution of a silicon solar cell.

As shown in FIG. 2, sunlight generally consists of about 3% of UV light, about 43% of visible light, and about 54% of IR light. For a silicon solar cell, some light components in the wavelength range from about 570 nm of visible light to about 1,120 nm of near-infrared light mainly contribute to generation of photoelectric current, and the remaining light components, that is, 15-25% of green and blue light having wavelengths of about 570 nm or less and long-wavelength radiation energy of near-infrared light having wavelengths of 1,120 nm or more, do not contribute to power generation.

In order to use light in the wavelength range that does not contribute to power generation, a recent solar cell structure includes a stack of solar cells, which use different types of wavelengths for power generation. However, such a solar cell structure is manufactured through a complicated process, increasing manufacturing cost.

Therefore, there is a need for a new technique which allows use of a wide wavelength range of light incident on a solar cell for power generation.

DISCLOSURE

Technical Problem

The present invention is conceived to solve the problems of the related art, and is aimed at providing a high efficiency solar cell and a method of manufacturing the same, which employ phosphors to improve use of light incident on the solar cell, thereby improving conversion efficiency of the solar cell.

Technical Solution

In accordance with an aspect of the invention, a high efficiency solar cell using phosphors includes a front section, which includes a front electrode and through which light enters the solar cell; a generator placed on a rear side of the front section and generating electricity using a light component in a predetermined wavelength range among light having passed through the front section; and a rear section placed on a rear side of the generator and including a rear electrode, wherein the rear electrode includes a first phosphor dispersed therein, and the first phosphor absorbs a light component having wavelengths outside the predetermined wavelength range used by the generator and emits a light component converted thereby from the wavelengths outside the predetermined wavelength range to wavelengths capable of being used by the generator for power generation.

The present invention may be applied to any type of solar cell and the configuration of the generator may differ according to the type of solar cell. Further, the type of phosphor is selected according to the wavelength range of light used by a selected generator in order to allow the phosphor to absorb a light component in a wavelength range, which is not used by the generator, and to emit another light component converted from the light component to wavelengths capable of being used by the generator. Here, it should be understood that any type of phosphor may be used so long as the phosphor has such a function.

The rear electrode may be composed of a Ag or Ag/Al paste, and the first phosphor is provided in the form of powder and is mixed in an amount of 3~60 wt % with the paste to be dispersed in the rear electrode. The first phosphor in the form of powder may have a particle diameter in the range from 3 nm to 10 μm. When provided to the rear electrode, the first phosphor is mixed in the form of powder with the paste to be evenly distributed in the rear electrode so as to improve wavelength conversion efficiency.

If the first phosphor in the form of powder has a particle diameter of less than 3 nm, there is a problem of deteriorating wavelength conversion efficiency and reflection efficiency.

On the contrary, if the first phosphor in the form of powder has a particle diameter of greater than 10 μm, it is difficult to distribute the powder in the paste, resistance of the rear electrode increases excessively, and screen printing cannot be applied.

If the amount of the first phosphor is less than 3 wt %, wavelength conversion efficiency by addition of the first phosphor is insignificant. On the other hand, if the amount of the first phosphor exceeds 60 wt %, the rear electrode suffers from increased resistance and deterioration in adhesion.

The rear section may further include a reflective film, which is formed on a rear side of the rear electrode and includes a second phosphor dispersed therein. The second phosphor may absorb a light component having wavelengths outside the predetermined wavelength range used by the generator and emit a light component converted thereby from the wavelengths outside the predetermined wavelength range to wavelengths capable of being used by the generator for power generation.

The reflective film may be composed of a polymer resin, and the second phosphor may be provided in the form of powder and mixed in an amount of 3~60 wt % with the polymer resin to be dispersed in the reflective film. The second phosphor in the form of powder may have a particle diameter in the range from 0.1 to 20 μm.

As the reflective film composed of the polymer resin and containing the phosphor is added to the rear side of the rear electrode, it is possible not only to reuse light passing through the rear electrode by reflecting the light, and but also to allow the light component having wavelengths outside the predetermined wavelength range used by the generator to be used for power generation, thereby improving power generation efficiency.

If the second phosphor in the form of powder has a particle diameter of less than 0.1 μm, there is a problem of deteriorating wavelength conversion efficiency and reflection efficiency. On the contrary, if the second phosphor in the form of powder has a particle diameter of greater than 20 μm, it is difficult to distribute the powder in the polymer resin. Thus, the second phosphor may have a particle size in the range from 0.1 μm to 20 μm.

If the amount of the second phosphor is less than 3 wt %, wavelength conversion efficiency by addition of the second phosphor is very insignificant. If the amount of the second phosphor exceeds 60 wt %, it is difficult to cure the polymer resin. Thus, the second phosphor may be added in an amount of 3 to 60 wt %.

The polymer resin for the reflective film may have a transmittance of 80% or more. The polymer resin may be at least one selected from the group consisting of polyethylene terephthalate (PET), ethylene vinyl acetate (EVA), polyvinyl butyral (PVB), polymethyl methacrylate (PMMA), and polycarbonate (PC).

The reflective film may have bubbles, which improve efficiency of reflecting and dispersing light.

Since the reflective film serves not only to improve efficiency of using light, but also to provide a buffering function for stably forming the rear section, the reflective film preferably has a thickness of 5 mm or less. If the thickness of the reflective film is less than 6 μm, it is difficult to distribute the phosphor therein, and the buffering effect of the reflective film is not obtained.

Further, the rear section may further include a reflective plate, which is formed on a rear side of the reflective film and include a third phosphor deposited on one side of the reflective film adjoining the reflective film. Here, the third phosphor may absorb a light component having wavelengths outside the predetermined wavelength range used by the generator and emit a light component converted thereby from the wavelengths outside the predetermined wavelength range to wavelengths capable of being used by the generator for power generation.

The reflective plate may be composed of a metallic material and the third phosphor may be deposited to a thickness ranging from 0.1 to 30 μm thereon.

A metallic plate, for example, an aluminum plate, is preferably disposed to reuse light passing through the reflective film by reflecting the light. In particular, the phosphor is deposited on the surface of the reflective plate to allow use of light components outside the wavelength range used by the generator for power generation, thereby improving power generation efficiency.

If the third phosphor is deposited to a thickness of less than 0.1 μm, wavelength conversion efficiency by addition of the third phosphor is very insignificant. On the other hand, if the third phosphor is deposited to a thickness exceeding 30 μm, reflection by the reflective plate is reduced. Thus, the third phosphor may be deposited to a thickness in the range described above.

All or some of the first to third phosphors may be different types of phosphor such that light absorbed by the phosphors has a different wavelength than light emitted therefrom. Alternatively, the first to third phosphors may be composed of the same type of phosphor.

The high efficiency solar cell according to the present invention may be a silicon solar cell in which the generator employs light in the wavelength range from about 570 nm to 1,150 nm for power generation. Here, in one exemplary embodiment, the first phosphor may be at least one selected from among $Y_2O_3$:Eu, $LiAlO_2$:Eu, $YVO_4$:Dy, $YBO_3$:Eu, ZnO:Eu and ZnS:Cu,Cl, and the second and third phosphors may be $NaYF_4$:Re.

In accordance with another aspect of the invention, a method of manufacturing a high efficiency solar cell is provided. Here, the high efficiency solar cell includes a front section through which light enters the solar cell; a generator placed on a rear side of the front section and generating electricity using a light component in a predetermined wavelength range among light having passed through the front section; and a rear section placed on a rear side of the generator. The method includes forming a rear electrode on a rear side of the generator by adding a first phosphor powder thereto, wherein the first phosphor absorbs a light component having wavelengths outside the predetermined wavelength range used by the generator and emits a light component converted thereby from the wavelengths outside the predetermined wavelength range to wavelengths capable of being used by the generator for power generation.

The forming the rear electrode may include: adding 3~60 wt % of the first phosphor powder to an Ag or Ag/Al paste, followed by mixing the first phosphor powder and the paste using a ball-mill; depositing the mixture on the rear side of the generator by screen printing, followed by drying the mixture to form the rear electrode on the rear side of the generator; and heat-treating the rear electrode. Here, the first phosphor powder may have a particle diameter in the range from 3 nm to 10 μm.

The method may further include: after forming the rear electrode, preparing a reflective film including a second phosphor powder, which absorbs a light component having wavelengths outside the predetermined wavelength range used by the generator and emits a light component converted thereby from the wavelengths outside the predetermined wavelength range to wavelengths capable of being used by the generator for power generation; and bonding the reflective film to a rear side of the rear electrode.

The preparing a reflective film may include: adding 3~60 wt % of the second phosphor powder to a polymer resin, followed by dissolving and mixing the second phosphor powder and the polymer resin; and heating the mixture on a flat vessel. Here, the polymer resin may be at least one selected from the group consisting of polyethylene terephthalate (PET), ethylene vinyl acetate (EVA), polyvinyl butyral (PVB), polymethyl methacrylate (PMMA), and polycarbonate (PC), and the second phosphor powder may have a particle diameter of 0.1~20 μm.

The preparing a reflective film may include further adding a foaming agent to the polymer resin, followed by mixing the foaming agent with the second phosphor powder and the polymer resin while blowing an inert gas thereto. By addition of the foaming agent, the reflective film may have bubbles.

The method may further include: after forming the reflective film, preparing a reflective plate coated with a third phosphor, which absorbs a light component having wavelengths outside the predetermined wavelength range used by the generator and emits a light component converted thereby from the wavelengths outside the predetermined wavelength range to wavelengths capable of being used by the generator for power generation; and bonding the reflective plate to a rear side of the reflective film.

The preparing a reflective plate may include preparing a phosphor paste by mixing 20~70 wt % of the third phosphor, 10~40 wt % of a polymer resin, and 10~40 wt % of a solvent; and screen printing and drying the phosphor paste on a metal plate. The third phosphor may be deposited on the metal plate in various ways including vacuum deposition.

The reflective film may be bonded to the reflective plate in various ways, for example, by applying a transparent polymer adhesive to all or part of contact surfaces of the rear electrode, the reflective film and the reflective plate. In particular, with the reflective film and the reflective plate sequentially placed on the rear side of the rear electrode, heat is applied to the reflective plate while compressing such that the reflective film is melt and bonded to the rear electrode and the reflective plate, thereby allowing the reflective film to be bonded to the rear electrode and the reflective plate without using the adhesive.

In the method according to this aspect of the present invention, the high efficiency solar cell may be a silicon solar cell in which the generator employs light in the wavelength range from about 570 nm to 1,150 nm for power generation. Here, in one exemplary embodiment, the first phosphor may be at least one selected from among $Y_2O_3$:Eu, $LiAlO_2$:Eu, $YVO_4$:Dy, $YBO_3$:Eu, ZnO:Eu and ZnS:Cu,Cl, and the second and third phosphors may be $NaYF_4$:Re.

Advantageous Effects

According to exemplary embodiments of the present invention, the rear section of the solar cell is provided with phosphors, which may absorb light components having wavelengths outside the predetermined wavelength range used by the generator and emit light components converted thereby from the wavelengths outside the predetermined wavelength range to wavelengths capable of being used by the generator for power generation so as to allow use of all of wavelength ranges of sunlight entering the solar cell, thereby improving efficiency of the solar cell.

In addition, the rear section including the phosphors is composed of three parts, thereby improving wavelength conversion efficiency of the phosphors and use efficiency of light entering the solar cell.

Figure 1:
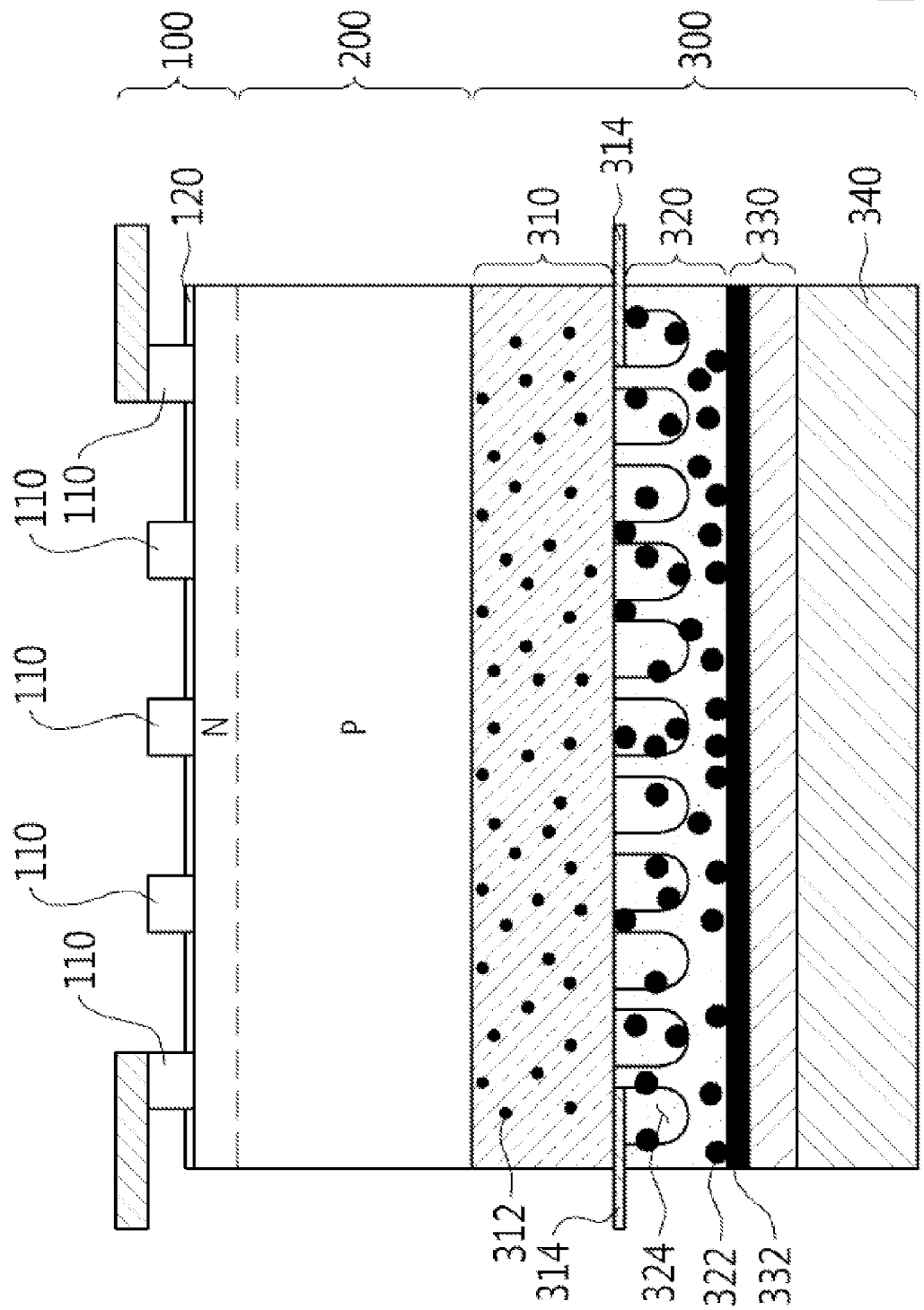
FIG. 1 is a diagram of a high efficiency solar cell according to one exemplary embodiment of the present invention.
Figure 2:
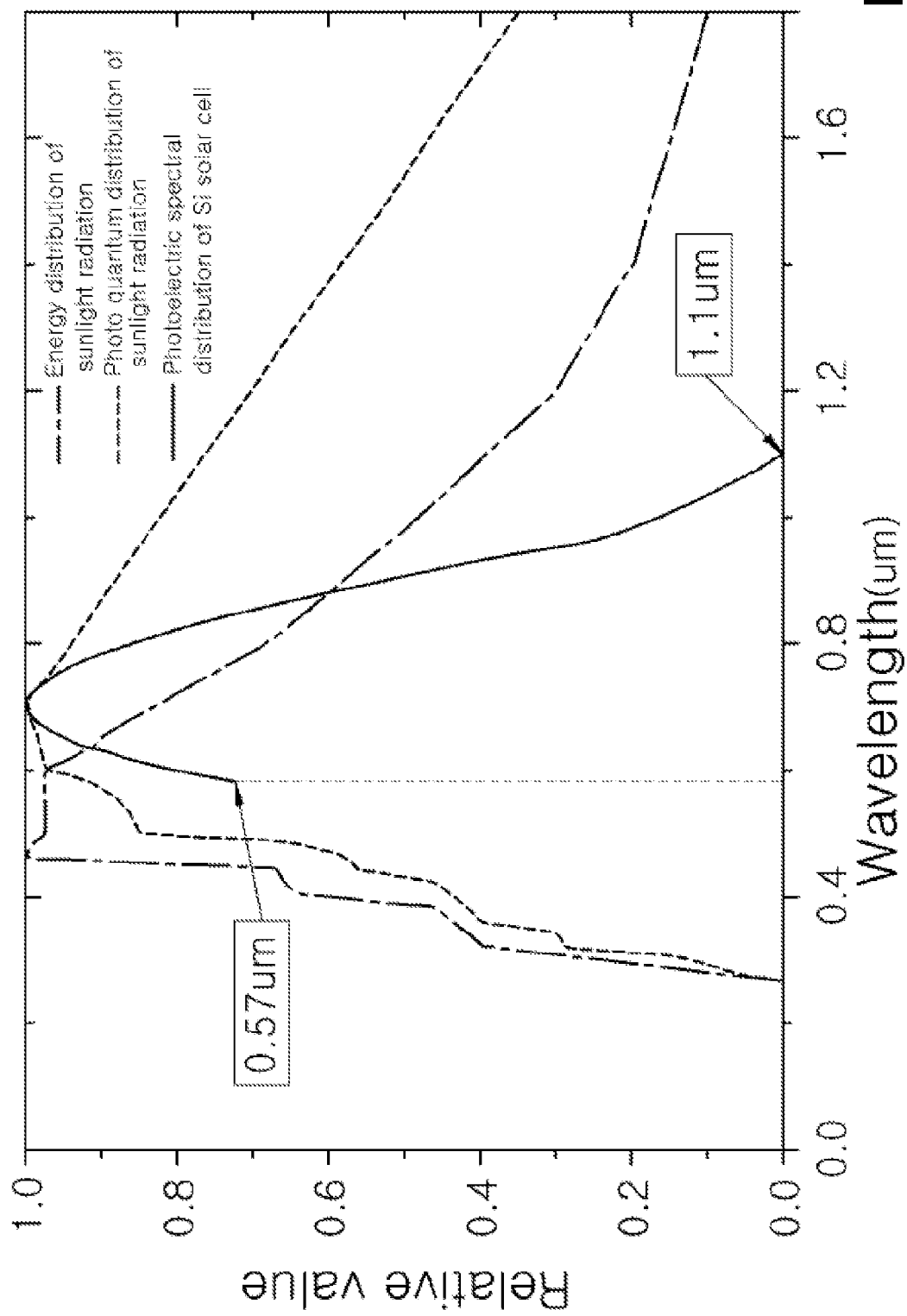
FIG. 2 is a graph depicting energy distribution of sunlight and spectral distribution of a silicon solar cell.

<Description of reference numerals of main parts of the drawings>

| | |
|---|---|
| 100: Front section | 110: Front electrode |
| 120: Front anti-reflection film | 200: Generator |
| 300: Rear section | 310: Rear electrode |
| 314: Electrode tap | 320: Reflective film |
| 324: Bubble | 330: Reflective plate |
| 332: Phosphor layer | 312, 322: Phosphor |
| 340: Support plate | |

BEST MODE

Exemplary embodiments of the present invention will be described in detail with reference to the accompanying drawings.

FIG. 1 is a diagram of a high efficiency solar cell according to one exemplary embodiment of the present invention.

According to this exemplary embodiment, the solar cell includes a front section 100, a generator 200, and a rear section 300.

The front section 100 is a part through which sunlight enter the solar cell. The front section 100 is formed with a front electrode 110, which adjoins the generator 200. Further, the front section 100 is formed with a front anti-reflection film 120 which reduces reflection of sunlight while promoting absorption of sunlight when sunlight is incident on the solar cell.

The generator 200 generates electricity using a light component of sunlight in a certain wavelength range. In this embodiment, a P-N junction silicon solar cell is used. The silicon solar cell employs a light component in the wavelength range from about 570 nm to 1,150 nm (hereinafter, referred to as the "wavelength range for power generation").

The rear section 300 includes a rear electrode 310, a reflective film 320, and a reflective plate 330. The rear electrode 310 is formed on a rear side of the generator 200 and electrically connected to the front electrode 110 to supply electricity generated in the generator 200 to the outside. Further, the rear electrode 310 includes phosphor powder 312, which absorbs a light component having wavelengths outside the wavelength range for power generation by the generator 200 and emits a light component converted to wavelengths in the wavelength range for power generation, thereby improving efficiency of the solar cell.

In this embodiment, the rear electrode 310 is formed by mixing the phosphor powder with common Ag paste, followed by screen printing the mixture on the rear side of the generator 200.

First, 25 g of $Y_2O_3$:Eu phosphor powder having a mean particle size of 4 μm, Ag paste, and 20 g of a diluted acetone solvent for the Ag paste are mixed using ultrasound waves and a ball mill for 30 minutes.

Then, the mixture is deposited on the rear side of the generator 200 by screen printing using a 200 mesh screen, followed by drying at 120° C. for 5 minutes, providing a 30 μm thick rear electrode.

Final heat treatment is performed at 750° C. for 10 minutes after both the front electrode 110 and the rear electrode 310 printed on the generator are dried. In the final rear electrode 310, the phosphor powder 312 is evenly dispersed in the Ag paste.

The reflective film 320 is formed on a rear side of the rear electrode 310 and includes phosphor powder 322, which absorbs a light component having wavelengths outside the wavelength range for power generation by the generator 200 and emits a light component converted to wavelengths in the wavelength range for power generation, thereby improving efficiency of the solar cell. In this embodiment, the reflective film 320 is formed of PET which is a transparent polymer. First, 20 g of NaYF4:Re rare-earth phosphor powder having a mean particle diameter of 4 μm and 30 g of an azo compound, for example, azodicarboxamide, are added to 100 g of PET dissolved in an acetonitrile solvent. Then, the mixture is sufficiently stirred in a pressure container while injecting argon gas into the pressure container, and is deposited to a thickness of 5 mm on a flat glass vessel, followed by heat treatment at 110° C. for 30 minutes. In the final reflective film 320, the NaYF4:Re rare-earth phosphor powder 322 is evenly dispersed in the transparent PET and bubbles 324 are formed by azodicarboxamide, which acts as a foaming agent.

The reflective plate 330 is formed on a rear side of the reflective film 320, and reflects light, which has passed through the generator 200, the rear electrode 310 and the reflective film 320, and light emitted from the phosphors in the rear electrode 310 or the reflective film 320 towards the generator 200 so as to allow the reflected light to pass through the generator 200, thereby improving power generation efficiency of the solar cell.

In this embodiment, the reflective plate 330 is formed by coating a phosphor on an Al plate exhibiting excellent surface gloss. The reflective plate 330 is formed by forming a phosphor layer 332 on the Al plate such that the phosphor layer 332 absorbs light having passed through the reflective film 320 without being converted to wavelengths in the wavelength range for power generation and emits light converted to the wavelengths in the wavelength range for power generation.

First, 20 g of $NaYF_4$:Re rare-earth phosphor powder having a mean particle diameter of 4 μm and 10 g of PET powder are dissolved in 10 g of an acetonitrile solvent to prepare a paste, which in turn is coated on a 1.0 mm thick Al plate using a 250 mesh screen by screen printing. Then, the coating is dried at 120° C. for 10 minutes.

Finally, a support plate 240 is attached to a rear side of the reflective plate 330 to support and protect the rear section 300 and the solar cell.

In order to attach the separate reflective film 320 and reflective plate 330 to the rear side of the rear electrode 310, the solar cell having the rear electrode 310 formed thereon, the reflective film 320 and the reflective plate 330 are stacked in this order, and maintained at 120° C. for 5 minutes under slight pressure. Here, an electrode tap 314 is placed between the rear electrode 310 and the reflective film 320 to connect the rear electrode 310 to the outside. In this process, PET of the reflective film 320 placed in the middle is melted and bonded to the rear electrode 310 and the reflective plate 330, thereby eliminating a need for separate adhesives.

Next, operation of the high efficiency solar cell according to the embodiment as shown in FIG. 1 will be described as follows.

First, sunlight enters the solar cell through the front section 100. In this case, when the front section is provided with additional elements, loss of some incident sunlight can occur. In this embodiment, since there is no additional element on the front section except for an element for improving efficiency of light incidence, incidence efficiency of sunlight is not deteriorated at all.

After entering the solar cell through the front section 100, sunlight is converted to electricity when passing through the generator composed of P-N junction silicon. Here, some light components in the wavelength range for power generation are absorbed into the generator 200 to be used for power generation, and the remaining light components pass through the generator 200.

Some of the light components having passed through the generator 200 are reflected by the surface of the rear electrode 310 and pass again through the generator 200, and some of the light components passing through the generator are used for power generation.

Among light components passing through the rear electrode 310 without being reflected by the surface of the rear electrode 310, the light components in absorption wavelengths of the phosphor 312 are absorbed by the phosphor 312 and emitted therefrom after being converted to wavelengths in the wavelength range for power generation by the phosphor 312. Among the light components emitted after being converted into the wavelengths in the wavelength range for power generation, the light components emitted towards the generator 200 are absorbed by the generator 200 and used for power generation.

Some of light components reaching the surface of the reflective film 320 through the rear electrode 310 are reflected by the surface of the reflective film 320 and pass again through the generator 200 such the light components in the wavelength range for power generation can be used for power generation.

Among light components passing through the reflective film 320 without being reflected by the surface of the reflective film 320, the light components in absorption wavelengths of the $NaYF_4$:Re rare-earth phosphor 322 are absorbed by the phosphor 312 and emitted therefrom after being converted to wavelengths in the wavelength range for power generation by the phosphor 322. Among the light components emitted after being converted into the wavelengths in the wavelength range for power generation, the light components emitted towards the generator 200 are absorbed by the generator 200 and used for power generation.

The reflective film 320 is formed with bubbles 324 both inside and on the surface of the reflective film 320. The bubbles 324 form a rugged surface of the reflective film 320. The bubbles 324 and the rugged surface of the reflective film improve reflection of light while enabling even dispersion of light.

Some of light components reaching the surface of the reflective plate 330 through the reflective film 320 are reflected by the surface of the reflective plate 330 and directed to pass through the generator 200 such the light components in the wavelength range for power generation can be used for power generation.

Among the light components reaching the surface of the reflective plate 330, the light components in absorption wavelengths of the $NaYF_4$:Re rare-earth phosphor are absorbed by the phosphor layer 332 and emitted towards the generator 200 therefrom after being converted to wavelengths in the wavelength range for power generation by the phosphor layer 332.

As such, the high efficiency solar cell according to this embodiment allows light in the wavelength range for power generation by the generator 200 and having passed through the generator 200 to be returned to the generator 200 through reflection by the rear electrode 310, the reflective film 320 and the reflective plate 330, thereby improving efficiency of the solar cell.

In addition, among light incident on the solar cell, the light components outside the wavelength range for power generation are converted to wavelengths in the wavelength range for power generation by the phosphors 312, 322, 332 in the rear electrode 310, the reflective film 320 and the reflective plate 330, thereby improving efficiency of the solar cell.

Further, the light components converted through the rear electrode 310, the reflective film 320 and the reflective plate 330 are also reflected towards the generator 200 by the reflective film 320 and the reflective plate 330, thereby maximizing the quantity of light passing through the generator 200.

Although some embodiments have been described herein, it should be understood by a person having ordinary knowledge in the art that these embodiments are given by way of illustration only, and that various modifications, variations, and alterations can be made without departing from the spirit and scope of the invention. Therefore, the scope of the invention should be limited only by the accompanying claims and equivalents thereof.

The invention claimed is:

1. A high efficiency solar cell using phosphors, the solar cell including a front section, which includes a front electrode and through which light enters the solar cell, a generator placed on a rear side of the front section and generating electricity using a light component in a predetermined wavelength range among light having passed through the front section, and a rear section placed on a rear side of the generator and including a rear electrode,
wherein the rear electrode is composed of a Ag or Ag/Al paste,
the rear electrode includes a first phosphor in the form of powder which is mixed in an amount of 3~60 wt % with the paste and is dispersed therein, the first phosphor absorbing a light component having wavelengths outside the predetermined wavelength range used by the generator and emitting a light component converted thereby from the wavelengths outside the predetermined wavelength range to wavelengths capable of being used by the generator for power generation.

2. The solar cell according to claim 1, wherein the first phosphor in the form of powder has a particle diameter ranging from 3 nm to 10 μm.

3. The solar cell according to claim 1, wherein the rear section further comprises a reflective film, which is formed on a rear side of the rear electrode and comprises a second phosphor dispersed therein, the second phosphor absorbing a light component having wavelengths outside the predetermined wavelength range used by the generator and emitting a light component converted thereby from the wavelengths outside the predetermined wavelength range to wavelengths capable of being used by the generator for power generation.

4. The solar cell according to claim 3, wherein the reflective film is composed of a polymer resin, and the second phosphor is provided in the form of powder having a particle diameter ranging from 0.1 to 20 μm and mixed in an amount of 3~60 wt % with the polymer resin to be dispersed in the reflective film.

5. The solar cell according to claim 4, wherein the polymer resin for the reflective film comprises at least one selected from the group consisting of polyethylene terephthalate (PET), ethylene vinyl acetate (EVA), polyvinyl butyral (PVB), polymethyl methacrylate (PMMA), and polycarbonate (PC).

6. The solar cell according to claim 4, wherein the reflective film has bubbles.

7. The solar cell according to claim 3, wherein the rear section further comprises a reflective plate, which is placed on a rear side of the reflective film and comprises a third phosphor deposited on one side of the reflective film adjoining the reflective film, the third phosphor absorbing a light component having wavelengths outside the predetermined wavelength range used by the generator and emitting a light component converted thereby from the wavelengths outside the predetermined wavelength range to wavelengths capable of being used by the generator for power generation.

8. The solar cell according to claim 7, wherein the reflective plate is composed of a metallic material and the third phosphor is deposited to a thickness ranging from 0.1 to 30 μm thereon.

9. The solar cell according to claim 1, wherein the generator is composed of at least one selected from among silicon, a compound, and an organic material, the first phosphor is at least one selected from among $Y_2O_3$:Eu, $LiAlO_2$:Eu, $YVO_4$:Dy, $YBO_3$:Eu, ZnO:Eu and ZnS:Cu,Cl.

10. A method of manufacturing a high efficiency solar cell using phosphors, the solar cell including a front section through which light enters the solar cell; a generator placed on a rear side of the front section and generating electricity using a light component in a predetermined wavelength range among light having passed through the front section; and a rear section placed on a rear side of the generator, the method comprising:
forming a rear electrode on a rear side of the generator by adding a first phosphor powder thereto, the first phosphor absorbing a light component having wavelengths outside the predetermined wavelength range used by the generator and emitting a light component converted thereby from the wavelengths outside the predetermined wavelength range to wavelengths capable of being used by the generator for power generation,
wherein the forming the rear electrode comprises:
adding 3~60 wt % of the first phosphor powder to a Ag or Ag/Al paste, followed by mixing the first phosphor powder and the paste using a ball-mill;
depositing the mixture on the rear side of the generator by screen printing, followed by drying the mixture to form the rear electrode on the rear side of the generator; and
heat-treating the rear electrode.

11. The method according to claim 10, wherein the first phosphor powder has a particle diameter ranging from 3 nm to 10 μm.

12. The method according to claim 10, further comprising:
after forming the rear electrode,
preparing a reflective film comprising a second phosphor powder, the second phosphor powder absorbing a light component having wavelengths outside the predetermined wavelength range used by the generator and emitting a light component converted thereby from the wavelengths outside the predetermined wavelength range to wavelengths capable of being used by the generator for power generation; and
bonding the reflective film to a rear side of the rear electrode.

13. The method according to claim 12, wherein the preparing a reflective film comprises:

adding 3~60 wt % of the second phosphor powder having a particle diameter ranging from 0.1 to 20 μm to a polymer resin, followed by dissolving and mixing the second phosphor powder and the polymer resin; and heating the mixture on a flat vessel.

14. The method according to claim 13, wherein the polymer resin comprises at least one selected from the group consisting of polyethylene terephthalate (PET), ethylene vinyl acetate (EVA), polyvinyl butyral (PVB), polymethyl methacrylate (PMMA), and polycarbonate (PC).

15. The method according to claim 13, wherein the preparing a reflective film comprises:

further adding a foaming agent to the polymer resin, followed by mixing the foaming agent with the second phosphor powder and the polymer resin while blowing an inert gas thereto.

16. The method according to claim 12, further comprising: after forming the reflective film, preparing a reflective plate coated with a third phosphor, the third phosphor absorbing a light component having wavelengths outside the predetermined wavelength range used by the generator and emitting a light component converted thereby from the wavelengths outside the predetermined wavelength range to wavelengths capable of being used by the generator for power generation; and bonding the reflective plate to a rear side of the reflective film.

17. The method according to claim 16, wherein the preparing a reflective plate comprises:

preparing a phosphor paste by mixing 20~70 wt % of the third phosphor, 10~40 wt % of a polymer resin, and 10~40 wt % of a solvent; and screen printing and drying the phosphor paste on a metal plate.

18. The method according to claim 16, wherein the bonding the reflective plate comprises:

sequentially placing the reflective film and the reflective plate on the rear side of the rear electrode; and applying heat to the reflective plate while compressing such that the reflective film is melted and bonded to the rear electrode and the reflective plate.

19. The method according to claim 10, wherein the generator is composed of at least one selected from among silicon, a compound, and an organic material, the first phosphor is at least one selected from among $Y_2O_3$:Eu, $LiAlO_2$:Eu, $YVO_4$:Dy, $YBO_3$:Eu, ZnO:Eu and ZnS:Cu,Cl.

20. The method according to claim 12, wherein the second phosphor is $NaYF_4$:Re.

21. The method according to claim 16, wherein the third phosphor is $NaYF_4$:Re.

22. The solar cell according to claim 3, wherein the second phosphor is $NaYF_4$:Re.

23. The solar cell according to claim 7, wherein the third phosphor is $NaYF_4$:Re.

* * * * *